(12) United States Patent
Moon et al.

(10) Patent No.: US 11,415,885 B2
(45) Date of Patent: *Aug. 16, 2022

(54) SEMICONDUCTOR PHOTORESIST COMPOSITION, AND METHOD OF FORMING PATTERNS USING THE COMPOSITION

(71) Applicant: Samsung SDI Co., Ltd., Yongin-si (KR)

(72) Inventors: Kyungsoo Moon, Suwon-si (KR); Eunmi Kang, Suwon-si (KR); Jaehyun Kim, Suwon-si (KR); Jimin Kim, Suwon-si (KR); Ran Namgung, Suwon-si (KR); Changsoo Woo, Suwon-si (KR); Hwansung Cheon, Suwon-si (KR); Seungyong Chae, Suwon-si (KR); Seung Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/036,693

(22) Filed: Sep. 29, 2020

(65) Prior Publication Data

US 2021/0109442 A1    Apr. 15, 2021

(30) Foreign Application Priority Data

Oct. 15, 2019    (KR) .................. 10-2019-0127958

(51) Int. Cl.
*G03F 7/004* (2006.01)
*C07F 7/22* (2006.01)
*H01L 21/311* (2006.01)
*H01L 21/027* (2006.01)
*H01L 21/3213* (2006.01)

(52) U.S. Cl.
CPC .......... *G03F 7/0042* (2013.01); *C07F 7/2224* (2013.01); *H01L 21/0274* (2013.01); *H01L 21/31116* (2013.01); *H01L 21/31144* (2013.01); *H01L 21/32135* (2013.01); *H01L 21/32139* (2013.01)

(58) Field of Classification Search
CPC ..... G03F 7/0042; G03F 7/0043; C07F 7/2224
See application file for complete search history.

(56) References Cited

U.S. PATENT DOCUMENTS

| | | | |
|---|---|---|---|
| 3,479,380 A | 11/1969 | Minleri | |
| 5,061,599 A | 10/1991 | Kudo et al. | |
| 5,286,599 A | 2/1994 | Babich et al. | |
| 6,103,448 A | 8/2000 | Kim et al. | |
| 6,607,867 B1 | 8/2003 | Kim et al. | |
| 6,689,540 B2 | 2/2004 | Aviram et al. | |
| 6,849,668 B1 | 2/2005 | Burrows et al. | |
| 7,294,449 B1 | 11/2007 | Gudeman et al. | |
| 7,312,013 B2 | 12/2007 | Takahashi et al. | |

(Continued)

FOREIGN PATENT DOCUMENTS

| | | |
|---|---|---|
| EP | 1 177 182 B1 | 11/2006 |
| JP | 50-72948 | 6/1975 |

(Continued)

OTHER PUBLICATIONS

Anderson, Christopher et al.; "The SEMATECH Berkeley MET: extending EUV learning down to 16nm half pitch"; Proc. Of SPIE; vol. 7969; 2011; 7pp.

(Continued)

*Primary Examiner* — Daborah Chacko-Davis

(74) *Attorney, Agent, or Firm* — Lewis Roca Rothgerber Christie LLP

(57) ABSTRACT

Disclosed are a semiconductor photoresist composition including an organometallic compound including at least one selected from compounds represented by Chemical Formulae 1 to 3 and a solvent, and a method of forming patterns using the semiconductor photoresist composition on an etching-objective layer to form a photoresist layer, patterning the photoresist layer to form a photoresist pattern, and etching the etching-objective layer using the photoresist pattern as an etching mask.

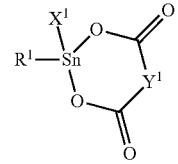

Chemical Formula 1

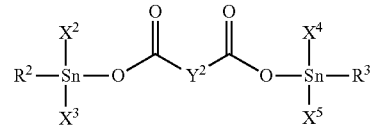

Chemical Formula 2

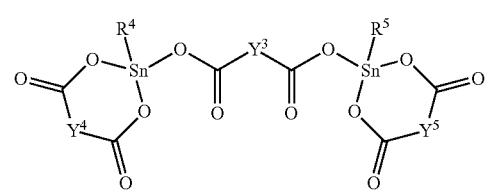

Chemical Formula 3

14 Claims, 4 Drawing Sheets

(56) References Cited

U.S. PATENT DOCUMENTS

| | | | |
|---|---|---|---|
| 7,323,275 B2 | 1/2008 | Otaki et al. | |
| 9,164,383 B2 | 10/2015 | Hatakeyama | |
| 9,261,784 B2 | 2/2016 | Wuister et al. | |
| 9,372,402 B2 | 6/2016 | Freedman et al. | |
| 2002/0072009 A1 | 6/2002 | Kim et al. | |
| 2003/0129740 A1 | 7/2003 | Seo et al. | |
| 2004/0248032 A1 | 12/2004 | Zampini et al. | |
| 2006/0128919 A1* | 6/2006 | Okamoto | C08G 65/336 528/25 |
| 2011/0045406 A1 | 2/2011 | Keszler et al. | |
| 2011/0184139 A1 | 7/2011 | Malik et al. | |
| 2012/0208127 A1 | 8/2012 | Hatakeyama | |
| 2013/0005150 A1 | 1/2013 | Ogihara et al. | |
| 2013/0224652 A1 | 8/2013 | Bass et al. | |
| 2016/0116839 A1 | 4/2016 | Meyers et al. | |
| 2016/0230019 A1 | 8/2016 | Yao et al. | |
| 2017/0052449 A1 | 2/2017 | Nakagawa et al. | |
| 2017/0102612 A1 | 4/2017 | Meyers et al. | |
| 2017/0146909 A1 | 5/2017 | Smith et al. | |
| 2017/0269476 A1 | 9/2017 | Nakagawa et al. | |
| 2019/0310552 A1 | 10/2019 | Asano et al. | |
| 2020/0041896 A1* | 2/2020 | Moon | H01L 21/0274 |
| 2021/0048745 A1 | 2/2021 | Meyers et al. | |

FOREIGN PATENT DOCUMENTS

| | | |
|---|---|---|
| JP | 2683536 B2 | 8/1997 |
| JP | 2002-72401 A | 3/2002 |
| JP | 2003-506532 A | 2/2003 |
| JP | 3904518 B2 | 4/2007 |
| JP | 3990146 B2 | 7/2007 |
| JP | 2008-7610 A | 1/2008 |
| JP | 5028887 B2 | 9/2012 |
| JP | 5178858 B2 | 1/2013 |
| JP | 5650086 B2 | 11/2014 |
| JP | 5708521 B2 | 3/2015 |
| JP | 6004649 B2 | 9/2016 |
| JP | 2017-207532 | 11/2017 |
| JP | 2018-502173 A | 1/2018 |
| JP | 2019-500490 A | 1/2019 |
| KR | 10-0269513 B1 | 10/2000 |
| KR | 10-2002-0005063 A | 1/2002 |
| KR | 10-0398312 B1 | 9/2003 |
| KR | 10-2004-0078584 A | 9/2004 |
| KR | 10-2014-0121826 A | 10/2014 |
| KR | 10-2017-0022945 A | 3/2017 |
| KR | 10-2017-0066225 A | 6/2017 |
| KR | 10-2017-0116134 A | 10/2017 |
| KR | 10-2018-0054917 A | 5/2018 |
| TW | 201831570 A | 9/2018 |
| WO | WO 2014/098076 A1 | 6/2014 |
| WO | WO 2016/140057 A1 | 9/2016 |
| WO | WO 2018123388 A1 | 7/2018 |

OTHER PUBLICATIONS

Okamoto, Hiroshi et al.; "Peroxypolytungstic acids: A new inorganic resist material"; Applied Physics Letters; 49; 298; 1986; 4pp.

Stowers, Jason K. et al.; "Directly patterned inorganic hardmask for EUV lithography"; Proc. Of SPIE; vol. 7969; 2011; 12pp.

Notice of Allowability (including Search Report dated Jul. 9, 2021) for Corresponding Taiwan Patent Application No. 109134748, dated Jul. 12, 2021 (3 pages).

Japanese Office Action dated Oct. 5, 2021, issued in corresponding Japanese Patent Application No. 2020-171971 (2 pages).

Korean Office Action dated Jan. 7, 2021, of the corresponding Korean Patent Application No. 10-2018-0089413 (6 pages).

U.S. Notice of Allowance from U.S. Appl. No. 16/211,114, dated Apr. 21, 2021, 7 pages.

U.S. Office Action from U.S. Appl. No. 16/211,114, dated Nov. 16, 2020, 8 pages.

U.S. Restriction Requirement from U.S. Appl. No. 16/211,114, dated Jun. 12, 2020, 7 pages.

* cited by examiner

[FIG. 1]
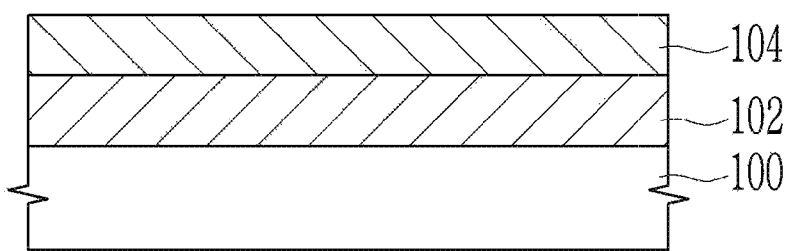
[FIG. 2]
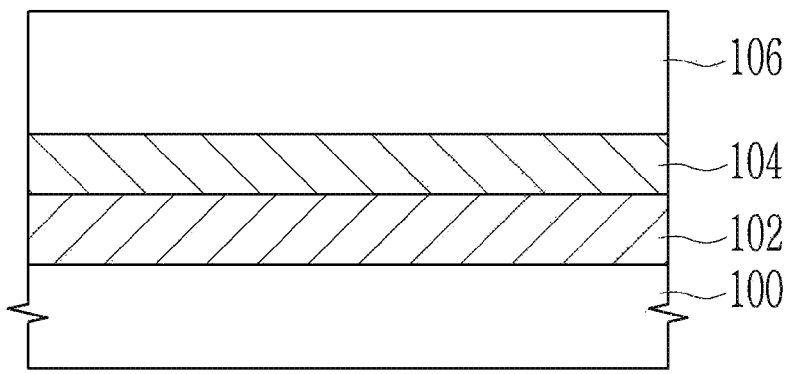

[FIG. 3]
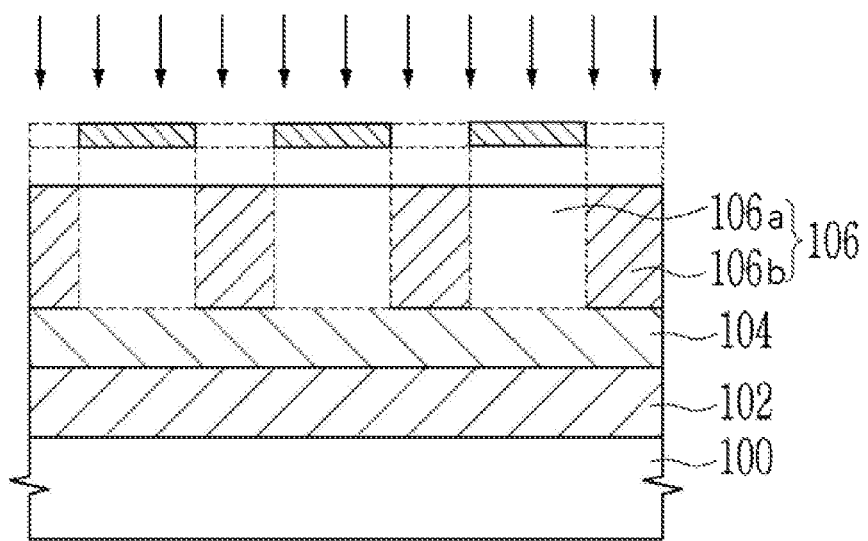

[FIG. 4]
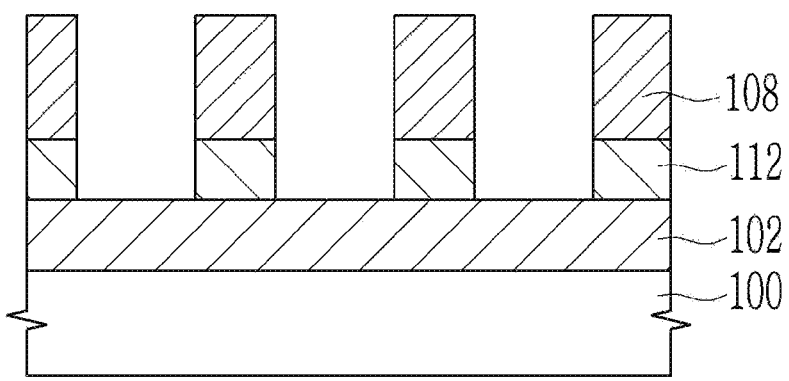

[FIG. 5]
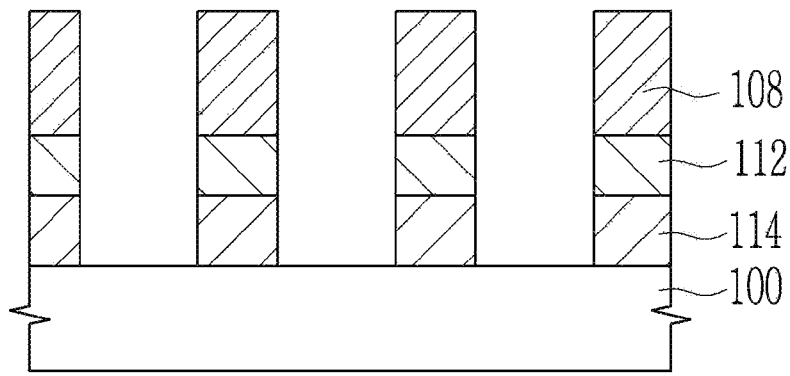

SEMICONDUCTOR PHOTORESIST COMPOSITION, AND METHOD OF FORMING PATTERNS USING THE COMPOSITION

CROSS-REFERENCE TO RELATED APPLICATION

This application claims priority to and the benefit of Korean Patent Application No. 10-2019-0127958 filed in the Korean Intellectual Property Office on Oct. 15, 2019, the entire contents of which are hereby incorporated by reference.

BACKGROUND

1. Field

Embodiments of the disclosure relate to a semiconductor photoresist composition and a method of forming patterns using the same.

2. Description of the Related Art

EUV (extreme ultraviolet) lithography has been used as a technology for manufacturing a next generation semiconductor device. EUV lithography is a pattern-forming technology using an EUV ray having a wavelength of about 13.5 nm as an exposure light source. EUV lithography may form an extremely fine pattern (e.g., less than or equal to about 20 nm) in an exposure process during a manufacture of a semiconductor device.

The extreme ultraviolet (EUV) lithography is realized through development of compatible photoresists which can be used to achieve a spatial resolution of less than or equal to about 16 nm. Currently, efforts to improve performance of existing chemically amplified (CA) photoresists such as resolution, photospeed, and feature roughness (also referred to as a line edge roughness or LER) for the next generation device are being made.

An intrinsic image blur due to an acid catalyzed reaction in these polymer-type photoresists (or polymer kind of photoresists) limits a resolution in small feature sizes, which has been a part of electron beam (e-beam) lithography for a long time. The chemically amplified (CA) photoresists are designed for high sensitivity, but because their existing elemental makeups reduce light absorbance of the photoresists at a wavelength of about 13.5 nm, and thus, decrease their sensitivity, the chemically amplified (CA) photoresists may partially have more difficulties under an EUV exposure.

In addition, the CA photoresists may have difficulties in the small feature sizes due to roughness issues, and line edge roughness (LER) of the CA photoresists has been shown through experimentation to be increased, as a photospeed is decreased partially due to an essence or nature of acid catalyst processes. Accordingly, a novel high performance photoresist would be beneficial in a semiconductor industry because of these defects and problems of the CA photoresists.

In order to overcome the aforementioned drawbacks of the chemically amplified (CA) photosensitive composition, an inorganic photosensitive composition has been researched. The inorganic photosensitive composition is mainly used for negative tone patterning having resistance against removal by a developer composition due to chemical modification through a nonchemical amplification mechanism. The inorganic composition contains an inorganic element having a higher EUV absorption rate than hydrocarbon, and thus, may provide or secure sensitivity through the nonchemical amplification mechanism and, in addition, is less sensitive with respect to a stochastic effect, and thus, produces low line edge roughness and a small number of defects.

In recent years, when cationic hafnium metal oxide sulfate (HfSOx) materials together with a peroxo complexing agent have been used to image a 15 nm half-pitch (HP) through projection EUV exposure, impressive performance has been obtained. However, it is difficult to handle a metal oxide-based inorganic resist having a peroxo complexing agent due to the use of a strong corrosive acid, and thus, storage stability is poor, and structural changes to improve performance are difficult.

SUMMARY

An embodiment provides a semiconductor photoresist composition having improved sensitivity and storage stability.

Another embodiment provides a method of forming patterns using the semiconductor photoresist composition.

A semiconductor photoresist composition according to an embodiment includes an organometallic compound including at least one selected from compounds represented by Chemical Formulae 1 to 3, and a solvent.

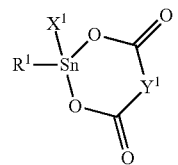

Chemical Formula 1

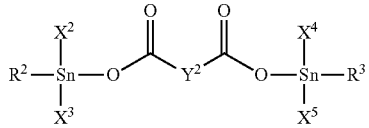

Chemical Formula 2

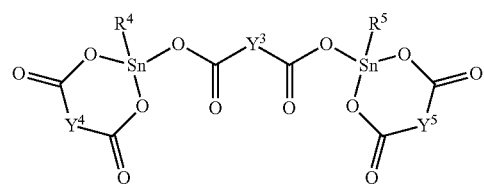

Chemical Formula 3

In Chemical Formulae 1 to 3, $R^1$ to $R^5$ are each independently a substituted or unsubstituted C1 to C20 alkyl group, a substituted or unsubstituted C3 to C20 cycloalkyl group, a substituted or unsubstituted C6 to C20 aryl group, or a combination thereof, $X^1$ to $X^5$ are each independently —$OR^a$ or —$OC(=O)R^b$, $R^a$ and $R^b$ are each independently hydrogen, a substituted or unsubstituted monovalent C1 to C20 saturated aliphatic hydrocarbon group, a substituted or unsubstituted monovalent C3 to C20 saturated alicyclic hydrocarbon group, a substituted or unsubstituted monovalent C2 to C20 unsaturated aliphatic hydrocarbon group including at least one double bond and/or triple bond, a substituted or unsubstituted monovalent C6 to C30 aromatic hydrocarbon group, or a combination thereof, and $Y^1$ to $Y^5$ are each independently a single bond, a substituted or unsubstituted divalent C1 to C20 saturated aliphatic hydrocarbon group, a substituted or unsubstituted divalent C3 to C20 saturated alicyclic hydrocarbon group, a substituted or unsubstituted divalent C2 to C20 unsaturated aliphatic hydrocarbon group including at least one double bond and/or triple bond, a substituted or unsubstituted divalent C6 to C20 aromatic hydrocarbon group, or a combination thereof.

$R^1$ to $R^5$ may each independently be a substituted or unsubstituted C1 to C10 alkyl group, a substituted or unsubstituted C3 to C10 cycloalkyl group, or a substituted or unsubstituted C6 to C10 aryl group, or a combination thereof, $R^a$ and $R^b$ may each independently be hydrogen, a substituted or unsubstituted monovalent C1 to C10 saturated aliphatic hydrocarbon group, a substituted or unsubstituted monovalent C3 to C10 saturated alicyclic hydrocarbon group, a substituted or unsubstituted monovalent C2 to C10 unsaturated aliphatic hydrocarbon group including 1 or 2 double bonds and/or triple bonds, a substituted or unsubstituted monovalent C6 to C10 aromatic hydrocarbon group, or a combination thereof, and $Y^1$ to $Y^5$ may each independently be a single bond, a substituted or unsubstituted divalent C1 to C8 saturated aliphatic hydrocarbon group, a substituted or unsubstituted divalent C3 to C6 saturated alicyclic hydrocarbon group, a substituted or unsubstituted divalent C2 to C8 unsaturated aliphatic hydrocarbon group including 1 or 2 double bonds and/or triple bonds, a substituted or unsubstituted divalent C6 to C10 arylene group, or a combination thereof.

$R^1$ to $R^5$ may each independently be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, a phenyl group, a tolyl group, a xylene group, a benzyl group, or a combination thereof, $R^a$ and $R^b$ may each independently be hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and $Y^1$ to $Y^5$ may each independently be a single bond, a methylene group, an ethylene group, a propylene group, a butylene group, a cyclobutylene group, a cyclopentylene group, a cyclohexylene group, an ethenylene group, a propenylene group, a phenylene group, or a combination thereof.

$R^1$ to $R^5$ may each independently be one of a methyl group, an ethyl group, an isopropyl group, a tert-butyl group, a phenyl group, and a benzyl group, $R^a$ and $R^b$ may each independently be a methyl group or an ethyl group, and $Y^1$ to $Y^5$ may each independently be one of a single bond, a methylene group, and an ethylene group.

In Chemical Formula 2, $R^2$ and $R^3$ may be the same, and $X^2$ to $X^5$ may be all the same.

In Chemical Formula 3, $R^4$ and $R^5$ may be the same, and $Y^4$ and $Y^5$ may be the same.

The semiconductor photoresist composition may include an organometallic compound including compounds that are respectively represented by each of Chemical Formulae 1 to 3.

The semiconductor photoresist composition may include about 1 wt % to about 20 wt % of the at least one selected from the compounds represented by Chemical Formulae 1 to 3, based on 100 wt % of the semiconductor photoresist composition.

The semiconductor photoresist composition may include about 1 wt % to about 20 wt % of the compound represented by Chemical Formula 1, based on 100 wt % of the semiconductor photoresist composition.

The semiconductor photoresist composition may include about 1 wt % to about 20 wt % of the compound represented by Chemical Formula 2, based on 100 wt % of the semiconductor photoresist composition.

The semiconductor photoresist composition may include about 1 wt % to about 20 wt % of the compound represented by Chemical Formula 3, based on 100 wt % of the semiconductor photoresist composition.

The semiconductor photoresist composition may further include an additive including a surfactant, a crosslinking agent, a leveling agent, or a combination thereof.

A method of forming patterns according to another embodiment includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

The photoresist pattern may be formed using light having a wavelength in a range of about 5 nm to about 150 nm.

The semiconductor photoresist composition according to an embodiment has improved storage stability and sensitivity characteristics and thus may provide a photoresist pattern having improved sensitivity and a high aspect ratio without a pattern collapse.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIGS. 1 to 5 are cross-sectional views illustrating a method of forming patterns using a semiconductor photoresist composition according to an embodiment.

DETAILED DESCRIPTION

Hereinafter, exemplary embodiments of the present disclosure will be described in more detail, referring to the accompanying drawings. However, in the description of the present disclosure, descriptions for functions or components that are readily understood by those of ordinary skill in the art may be omitted for clarity of description of the subject matter of the present disclosure.

In order to clearly describe the subject matter of the present disclosure, parts which are not related to the present description are omitted, and the same reference numeral refers to the same or like components, throughout the specification. In addition, because the size and the thickness of each component shown in the drawing are optionally represented for convenience of the description, the present disclosure is not limited to the illustrations herein.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

As used herein, the term "substituted" refers to replacement of a hydrogen atom by deuterium, a halogen, a hydroxy group, a cyano group, a nitro group, —NRR' (wherein, R and R' are independently hydrogen, a substituted or unsubstituted monovalent C1 to C30 saturated or unsaturated aliphatic hydrocarbon group, a substituted or unsubstituted monovalent C3 to C30 saturated or unsaturated alicyclic hydrocarbon group, or a substituted or unsubstituted monovalent C6 to C30 aromatic hydrocarbon group), —SiRR'R" (wherein, R, R', and R" are independently hydrogen, a substituted or unsubstituted monovalent C1 to C30 saturated or unsaturated aliphatic hydrocarbon group, a substituted or unsubstituted monovalent C3 to C30 saturated or unsaturated alicyclic hydrocarbon group, or a substituted or unsubstituted monovalent C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof, unless a specific definition is otherwise provided. "Unsubstituted" refers to non-replacement of a hydrogen atom by another substituent and remaining of the hydrogen atom.

As used herein, when a specific definition is not otherwise provided, the term "hetero" refers to one including 1 to 3 heteroatoms selected from N, O, S, and P, and remaining carbon atoms in one functional group.

As used herein, when a definition is not otherwise provided, the term "alkyl group" refers to a linear or branched aliphatic hydrocarbon group. In some embodiments, the alkyl group may be "a saturated alkyl group" without any double bonds or triple bonds.

The alkyl group may be a C1 to C20 alkyl group. For example, the alkyl group may be a C1 to C10 alkyl group, a C1 to C8 alkyl group, a C1 to C6 alkyl group, or a C1 to C4 alkyl group. For example, the C1 to C4 alkyl group may be a methyl, ethyl, propyl, isopropyl, n-butyl, isobutyl, sec-butyl, or tert-butyl group.

As used herein, the term "saturated aliphatic hydrocarbon group" refers to a hydrocarbon group in which a bond between a carbon atom and another carbon atom in a molecule is formed of a single bond (e.g., in which each bond between each of the carbon atoms of the molecule is a single bond).

The saturated aliphatic hydrocarbon group may be a C1 to C20 saturated aliphatic hydrocarbon group. For example, the saturated aliphatic hydrocarbon group may be a C1 to C10 saturated aliphatic hydrocarbon group, a C1 to C8 saturated aliphatic hydrocarbon group, a C1 to C6 saturated aliphatic hydrocarbon group, C1 to C4 saturated aliphatic hydrocarbon group, or a C1 to C2 saturated aliphatic hydrocarbon group. For example, the C1 to C6 saturated aliphatic hydrocarbon group may be a methyl group, an ethyl group, a propyl group, an isopropyl group, an n-butyl group, an isobutyl group, a sec-butyl group, a 2,2-dimethylpropyl group, or a tert-butyl group.

As used herein, the term "saturated alicyclic hydrocarbon group" refers to a hydrocarbon group including a ring in which a bond between a carbon atom and another carbon atom in a molecule is formed of a single bond (e.g., in which each bond between each of the carbon atoms of the molecule is a single bond).

The saturated alicyclic hydrocarbon group may be a C3 to C10 saturated alicyclic hydrocarbon group. For example, the saturated alicyclic hydrocarbon group may be a C3 to C8 saturated alicyclic hydrocarbon group, a C3 to C6 saturated alicyclic hydrocarbon group, a C3 to C5 saturated alicyclic hydrocarbon group, or a C3 or C4 saturated alicyclic hydrocarbon group. For example, the C3 to C6 saturated alicyclic hydrocarbon group may be a cyclopropyl group, a cyclobutyl group, a cyclopentyl group, or a cyclohexyl group.

As used herein, the term "unsaturated aliphatic hydrocarbon group" refers to a hydrocarbon group including a bond in which a bond between a carbon atom and another carbon atom in a molecule is a double bond, a triple bond, or a combination thereof (e.g., the hydrocarbon group includes at least one carbon atom double bonded or triple bonded to another carbon atom in the hydrocarbon group).

The unsaturated aliphatic hydrocarbon group may be a C2 to C20 unsaturated aliphatic hydrocarbon group. For example, the unsaturated aliphatic hydrocarbon group may be a C2 to C10 unsaturated aliphatic hydrocarbon group, a C2 to C8 unsaturated aliphatic hydrocarbon group, a C2 to C6 unsaturated aliphatic hydrocarbon group, or a C2 to C4 unsaturated aliphatic hydrocarbon group. For example, the C2 to C4 unsaturated aliphatic hydrocarbon group may be a vinyl group, an ethynyl group, an allyl group, a 1-propenyl group, a 2-propenyl group, a 1-propynyl group, a 2-propynyl group, a 1-butenyl group, a 2-butenyl group, a 3-butenyl group, 1-butynyl group, 2-butynyl group, and 3-butynyl group.

As used herein, the term "unsaturated alicyclic hydrocarbon group" refers to a hydrocarbon group including a ring including a bond between carbon atoms that is a double bond and/or a triple bond.

The unsaturated alicyclic hydrocarbon group may be a C3 to C10 unsaturated alicyclic hydrocarbon group. For example, the unsaturated alicyclic hydrocarbon group may be a C3 to C8 unsaturated alicyclic hydrocarbon group, a C3 to C6 unsaturated alicyclic hydrocarbon group, a C3 to C5 unsaturated alicyclic hydrocarbon group, or a C3 or C4 unsaturated alicyclic hydrocarbon group. For example, the C3 to C6 unsaturated alicyclic hydrocarbon group may be a 1-cyclopropenyl group, a 2-cyclopropenyl group, a 1-cyclobutenyl group, a 2-cyclobutenyl group, a 1-cyclopentenyl group, a 2-cyclopentenyl group, a 3-cyclopentenyl group, a 1-cyclohexenyl group, a 2-cyclohexenyl group, or a 3-cyclohexenyl group.

As used herein, the term "aromatic hydrocarbon group" refers to a hydrocarbon group including an aromatic ring group in the molecule.

The aromatic hydrocarbon group may be a C6 to C10 aromatic hydrocarbon group. For example, the aromatic hydrocarbon group may be a phenyl group or a naphthalene group.

As used herein, unless otherwise defined, the term "alkenyl group" refers to an aliphatic unsaturated alkenyl group including at least one double bond as a linear or branched aliphatic hydrocarbon group.

As used herein, when a definition is not otherwise provided, the term "cycloalkyl group" refers to a monovalent cyclic aliphatic hydrocarbon group.

As used herein, the term "aryl group" refers to a substituent in which all atoms in the cyclic substituent have a p-orbital and these p-orbitals are conjugated and may include a monocyclic or fused ring polycyclic functional group (e.g., rings sharing adjacent pairs of carbon atoms) functional group.

The semiconductor photoresist composition according to an embodiment of the present disclosure includes an organometallic compound and a solvent. The organometallic compound includes at least one selected from compounds represented by Chemical Formulae 1 to 3.

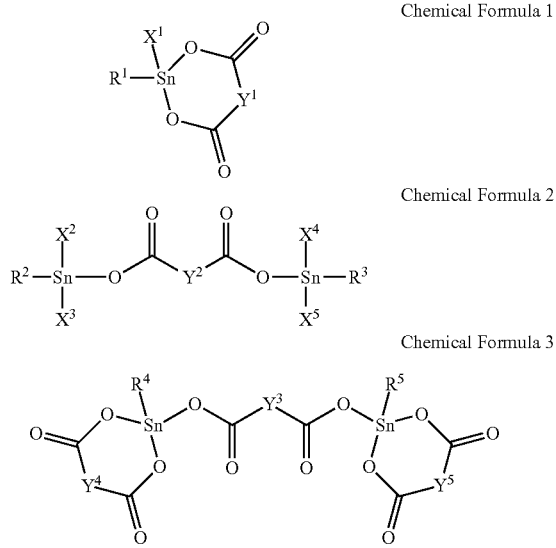

Chemical Formula 1

Chemical Formula 2

Chemical Formula 3

In Chemical Formulae 1 to 3, $R^1$ to $R^5$ are independently a substituted or unsubstituted C1 to C20 alkyl group, a substituted or unsubstituted C3 to C20 cycloalkyl group, a substituted or unsubstituted C6 to C20 aryl group, or a combination thereof, $X^1$ to $X^5$ are independently —$OR^a$ or —$OC(=O)R^b$, $R^a$ and $R^b$ are independently hydrogen, a substituted or unsubstituted monovalent C1 to C20 saturated aliphatic hydrocarbon group, a substituted or unsubstituted monovalent C3 to C20 saturated alicyclic hydrocarbon group, a substituted or unsubstituted monovalent C2 to C20 unsaturated aliphatic hydrocarbon group including at least one double bond and/or triple bond, a substituted or unsubstituted monovalent C6 to C30 aromatic hydrocarbon group, or a combination thereof, and $Y^1$ to $Y^5$ are independently a single bond, a substituted or unsubstituted divalent C1 to C20 saturated aliphatic hydrocarbon group, a substituted or unsubstituted divalent C3 to C20 saturated alicyclic hydrocarbon group, a substituted or unsubstituted divalent C2 to C20 unsaturated aliphatic hydrocarbon group including at least one double bond and/or triple bond, a substituted or unsubstituted divalent C6 to C20 aromatic hydrocarbon group, or a combination thereof.

The organometallic compound may include at least one selected from the compounds represented by Chemical Formulae 1 to 3. The compounds represented by Chemical Formulae 1 to 3 may include tin (Sn), which strongly absorbs extreme ultraviolet (UV) light at about 13.5 nm, and thus, exhibits excellent sensitivity about the light having high energy (e.g., exhibits excellent sensitivity at a suitable wavelength such as, for example, about 13.5 nm).

In some embodiments, the organotin compounds represented by Chemical Formulae 1 to 3 include tin (Sn) elements and dicarboxylic acid groups in the molecules, and one of the dicarboxylic acid groups is twice bonded with the tin (Sn) elements and has the form of a bidentate ligand. For example, in Chemical Formula 1, the Sn atom is bonded to two carboxylic acid groups, and in Chemical Formula 3, each of the Sn atoms is bonded to three carboxylic acid groups.

Because the dicarboxylic acid group is twice bonded with the tin (Sn) elements and to become the bidentate ligand, the molecules have a structure that the dicarboxylic acid groups surround the tin (Sn) elements, thereby providing a much bulkier structure. Accordingly, the dicarboxylic acid groups play a role of blocking the tin (Sn) elements from contacting moisture (or reducing such contact with moisture), and resultantly, the semiconductor photoresist composition including at least one selected from compounds represented by Chemical Formulae 1 to 3 has less moisture penetration, and thus, excellent storage stability.

In some embodiments, the compounds represented by Chemical Formulae 1 to 3 may further include an organic ligand hydrolyzed to form a Sn—O bond in addition to the substituents $R^1$ to $R^5$. This organic ligand is hydrolyzed with or without a heat treatment under an acidic or basic catalyst and accordingly, forms the Sn—O—Sn bond between the organotin compounds and thereby, an organotin copolymer including at least one of the compounds represented by Chemical Formulae 1 to 3 is formed. The organic ligand hydrolyzed to form the Sn—O bond may include any suitable organic ligand generally used or available in the art. In some embodiments, the organic ligand may include a hydroxy group, a carboxyl group, an alkoxy group, a halogen, a (meth)acrylate group, an epoxy group, an amine group, and/or the like, but the present disclosure is not limited thereto.

$R^1$ to $R^5$ may each independently be a substituted or unsubstituted C1 to C10 alkyl group, a substituted or unsubstituted C3 to C10 cycloalkyl group, a substituted or unsubstituted C6 to C10 aryl group, or a combination thereof. For example, $R^1$ to $R^5$ may each independently be one selected from a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, a phenyl group, a tolyl group, a xylene group, a benzyl group, or a combination thereof, and they may suitably or desirably independently be one selected from a methyl group, an ethyl group, an isopropyl group, a tert-butyl group, a phenyl group, and a benzyl group.

$R^1$ to $R^5$ are individually bonded with the tin (Sn) elements, and thus, form Sn—R bonds, which gives organic dissolubility for a solvent to the compound (e.g., allows the compound to dissolve in an organic solvent). In addition, the organotin copolymer formed through copolymerization of at least one selected from the compounds represented by Chemical Formulae 1 to 3 generates radicals. For example, when an R functional group is dissociated from an Sn—R bond during extreme ultraviolet (UV) exposure, the radicals form —Sn—O—Sn— bonds through additional radical reactions, and thus, initiate a condensation polymerization reaction between the organotin copolymers and form a semiconductor photoresist from the composition according to an embodiment.

$R^a$ and $R^b$ may each independently be hydrogen, a substituted or unsubstituted monovalent C1 to C10 saturated aliphatic hydrocarbon group, a substituted or unsubstituted monovalent C3 to C10 saturated alicyclic hydrocarbon group, a substituted or unsubstituted monovalent C2 to C10 unsaturated aliphatic hydrocarbon group including 1 or 2 double bonds and/or triple bonds, a substituted or unsubstituted monovalent C6 to C10 aromatic hydrocarbon group, or a combination thereof. For example, $R^a$ and $R^b$ may each independently be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and they may suitably or desirably independently be a methyl group, or an ethyl group.

$Y^1$ to $Y^5$ may independently be a single bond, a substituted or unsubstituted divalent C1 to C8 saturated aliphatic hydrocarbon group, a substituted or unsubstituted divalent C3 to C6 saturated alicyclic hydrocarbon group, a substituted or unsubstituted divalent C2 to C8 unsaturated aliphatic hydrocarbon group including 1 or 2 double bonds and/or triple bonds, a substituted or unsubstituted divalent C6 to C10 arylene group, or a combination thereof, and they may suitably or desirably independently be one selected from a single bond, a methylene group, and an ethylene group.

$Y^1$ to $Y^5$ are linking groups linking two carboxyl groups in the dicarboxylic acid group, and the number of carbon atoms included in $Y^1$ to $Y^5$ determines the length of a chain or a ring of the compounds represented by Chemical Formulae 1 to 3. Accordingly, as the number of carbon atoms included in $Y^1$ to $Y^5$ is larger, the compounds represented by Chemical Formulae 1 to 3 have a larger molecular size. Herein, when the number of carbon atoms included in $Y^1$ to $Y^5$ is extremely large, for example, greater than about 20, the moisture blocking effect of the dicarboxylic acid groups in the molecules of the compounds represented by Chemical Formulae 1 to 3 may be reduced, and consequently, moisture stability and/or storage stability characteristics of the semiconductor photoresist composition including the compounds represented by Chemical Formulae 1 to 3 is deteriorated or reduced.

$R^2$ and $R^3$ in Chemical Formula 2 may be the same as each other, and $X^2$ to $X^5$ may all be the same as each other. In some embodiments, when $R^2$ and $R^3$ in Chemical Formula 2 are the same as each other, and $X^2$ to $X^5$ are all the same as each other, the compound represented by Chemical Formula 2 may have a symmetrical structure.

$R^4$ and $R^5$ in Chemical Formula 3 may be the same as each other, and $Y^4$ and $Y^5$ may be the same as each other. In some embodiments, when $R^4$ and $R^5$ of Chemical Formula 3 are the same as each other, and $Y^4$ and $Y^5$ are the same as each other, the compound represented by Chemical Formula 3 may have a symmetrical structure.

The organometallic compound includes at least one selected from among the compounds represented by Chemical Formulae 1 to 3, for example, any one compound alone or any two compounds selected from among the compounds represented by Chemical Formulae 1 to 3 or all of the compounds represented by Chemical Formulae 1 to 3. For example, the organometallic compound may include one compound represented by Chemical Formulae 1, 2, or 3, the organometallic compound may include two compounds each independently represented by Chemical Formulae 1, 2, or 3, or the organometallic compound may include three compounds respectively represented by Chemical Formulae 1 to 3.

The semiconductor photoresist composition may include at least one selected from the compounds represented by Chemical Formulae 1 to 3 in an amount in a range of about 1 wt % to about 20 wt %, for example, about 1 wt % to about 18 wt %, for example, about 1 wt % to about 15 wt %, for example, about 1 wt % to about 13 wt %, for example, about 1 wt % to about 10 wt %, for example, about 1 wt % to about 8 wt %, for example, about 1 wt % to about 5 wt %, for example, about 1 wt % to about 3 wt %, based on 100 wt % of the semiconductor photoresist composition. When the semiconductor photoresist composition includes at least one selected from the compounds represented by Chemical Formulae 1 to 3 within the above wt % ranges, moisture stability and/or storage stability of the semiconductor photoresist composition may be improved.

The semiconductor photoresist composition may include the compound represented by Chemical Formula 1 in an amount in a range of about 1 wt % to about 20 wt %, for example, about 1 wt % to about 18 wt %, for example, about 1 wt % to about 15 wt %, for example, about 1 wt % to about 13 wt %, for example, about 1 wt % to about 10 wt %, for example, about 1 wt % to about 8 wt %, for example, about 1 wt % to about 5 wt %, for example, about 1 wt % to about 3 wt %, based on 100 wt % of the semiconductor photoresist composition.

The semiconductor photoresist composition may include the compound represented by Chemical Formula 2 in an amount in a range of about 1 wt % to about 20 wt %, for example, about 1 wt % to about 18 wt %, for example, about 1 wt % to about 15 wt %, for example, about 1 wt % to about 13 wt %, for example, about 1 wt % to about 10 wt %, for example, about 1 wt % to about 8 wt %, for example, about 1 wt % to about to 5 wt %, for example, about 1 wt % to about 3 wt %, based on 100 wt % of the semiconductor photoresist composition.

The semiconductor photoresist composition may include the compound represented by Chemical Formula 3 in an amount in a range of about 1 wt % to about 20 wt %, for example, about 1 wt % to about 18 wt %, for example, about 1 wt % to about 15 wt %, for example, about 1 wt % to about 13 wt %, for example, about 1 wt % to about 10 wt %, for example, about 1 wt % to about 8 wt %, for example, about 1 wt % to about 5 wt %, for example, about 1 wt % to about 3 wt %, based on 100 wt % of the semiconductor photoresist composition.

The solvent included in the semiconductor photoresist composition according to an embodiment may be an organic solvent. The solvent may be, for example, aromatic compounds (e.g., xylene, toluene, etc.), alcohols (e.g., 4-methyl-2-pentenol, 4-methyl-2-propanol, 1-butanol, methanol, isopropyl alcohol, 1-propanol, etc.), ethers (e.g., anisole, tetrahydrofuran, etc.), esters (n-butyl acetate, propylene glycol monomethyl ether acetate, ethyl acetate, ethyl lactate), ketones (e.g., methyl ethyl ketone, 2-heptanone), or a mixture thereof, but the present disclosure is not limited thereto.

In an embodiment, the semiconductor photoresist composition may further include a resin in addition to the aforementioned organometallic compound and solvent.

The resin may be a phenol-based resin including at least one or more aromatic moieties of Group 1.

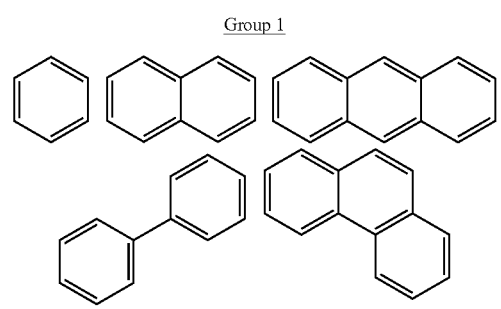

Group 1

-continued

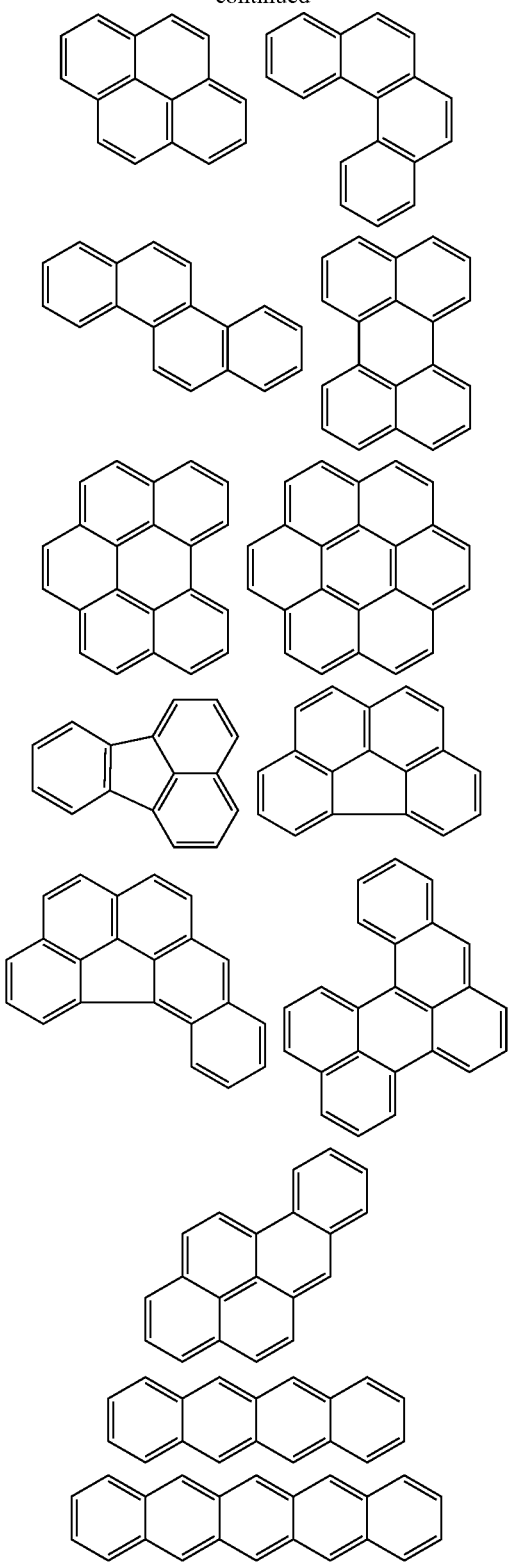

The resin may have a weight average molecular weight in a range of about 500 to about 20,000.

The resin may be included in an amount in a range of about 0.1 wt % to about 50 wt %, based on a total amount of the semiconductor photoresist composition.

When the resin is included within the foregoing amount range, it may have excellent etch resistance and heat resistance.

In some embodiments, the semiconductor photoresist composition is suitably or desirably composed of the organometallic compound, solvent, and resin. However, the semiconductor photoresist composition according to the above embodiment may further include an additive as needed or desired. Examples of the additive may include a surfactant, a cross-linking agent, a leveling agent, or a combination thereof.

The surfactant may include, for example, an alkyl benzene sulfonate salt, an alkyl pyridinium salt, polyethylene glycol, a quaternary ammonium salt, or a combination thereof, but the present disclosure is not limited thereto.

The cross-linking agent may be, for example, a melamine-based cross-linking agent, a substituted urea-based cross-linking agent, or a polymer-based cross-linking agent, but the present disclosure is not limited thereto. It may be a cross-linking agent having at least two cross-linking forming substituents such as, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and/or the like.

The leveling agent may be used for improving coating flatness (e.g., to provide a substantially flat surface) during printing and may be any suitable, commercially available leveling agent.

A use amount of the additives may be controlled or adjusted depending on suitable or desired properties.

In addition, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be, for example, a silane compound including a carbon-carbon unsaturated bond such as vinyltrimethoxysilane, vinyltriethoxysilane, vinyl trichlorosilane, vinyltris(β-methoxyethoxy)silane; and/or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like, but the present disclosure is not limited thereto.

The semiconductor photoresist composition may be formed into a pattern having a high aspect ratio without (or substantially without) a collapse. Accordingly, in order to form a fine pattern having a width in a range of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor photoresist composition may be used for a photoresist process using light having a wavelength in a range from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be used to realize extreme ultraviolet (UV) lithography using an EUV light source having a wavelength of about 13.5 nm.

According to an embodiment, a method of forming patterns using the aforementioned semiconductor photoresist composition is provided. For example, the manufactured pattern may be a photoresist pattern.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer using the photoresist pattern as an etching mask.

Hereinafter, a method of forming patterns using the semiconductor photoresist composition is described referring to FIGS. 1 to 5. FIGS. 1 to 5 are cross-sectional views illustrating a method of forming patterns using a semiconductor photoresist composition according to an embodiment.

Referring to FIG. 1, an object for etching is prepared. The object for etching may be a thin layer 102 formed on a semiconductor substrate 100. Hereinafter, the object for etching is described as the thin layer 102, but the present disclosure is not limited thereto. An entire surface of the thin layer 102 is washed to remove impurities and the like remaining thereon. The thin layer 102 may be for example a silicon nitride layer, a polysilicon layer, and/or a silicon oxide layer.

Subsequently, the resist underlayer composition for forming a resist underlayer 104 is spin-coated on the surface of the washed thin layer 102. However, the present disclosure is not limited thereto, and various suitable coating methods generally used or available in the art may be used. In some embodiments, the coating method may include a spray coating, a dip coating, a knife edge coating, a printing method, for example an inkjet printing method and/or a screen printing method, and/or the like may be used.

The coating process of the resist underlayer may be omitted, and hereinafter, a process including a coating of the resist underlayer is described.

Then, the coated composition is dried and baked to form a resist underlayer 104 on the thin layer 102. The baking may be performed at a temperature in a range of about 100° C. to about 500° C., for example, about 100° C. to about 300° C.

The resist underlayer 104 is formed between the substrate 100 and a photoresist layer 106 and thus may prevent or reduce non-uniformity and pattern-forming capability of a photoresist line width when a ray reflected from on the interface between the substrate 100 and the photoresist layer 106 or a hard mask between layers is scattered into an unintended photoresist region.

Referring to FIG. 2, the photoresist layer 106 is formed by coating the semiconductor photoresist composition on the resist underlayer 104. The photoresist layer 106 is obtained by coating the aforementioned semiconductor photoresist composition on the thin layer 102 formed on the substrate 100 and then, curing it through a heat treatment.

In some embodiments, the formation of a pattern by using the semiconductor photoresist composition may include coating the semiconductor photoresist composition through spin coating, slit coating, inkjet printing, and/or the like on the substrate 100 including the thin layer 102 and then, drying it to form the photoresist layer 106.

The semiconductor photoresist composition has already been illustrated and described, and therefore, redundant description thereof will not be repeated here.

Subsequently, a substrate 100 having the photoresist layer 106 is subjected to a first baking process. The first baking process may be performed at a temperature in a range of about 80° C. to about 120° C.

Referring to FIG. 3, the photoresist layer 106 may be selectively exposed.

For example, the exposure may use an activation radiation with light having a high energy wavelength such as EUV (Extreme Ultraviolet; a wavelength of about 13.5 nm), an E-Beam (an electron beam), and/or the like as well as a short wavelength such as an i-line (a wavelength of about 365 nm), a KrF excimer laser (a wavelength of about 248 nm), an ArF excimer laser (a wavelength of about 193 nm), and/or the like.

In some embodiments, light for the exposure according to an embodiment may have a short wavelength in a range from about 5 nm to about 150 nm and a high energy wavelength, for example, EUV (Extreme Ultraviolet; a wavelength of about 13.5 nm), an E-Beam (an electron beam), and/or the like.

The exposed region 106*b* of the photoresist layer 106 has a different solubility than the non-exposed region 106*a* of the photoresist layer 106 by forming a polymer by a cross-linking reaction such as condensation (e.g., a condensation reaction) between organometallic compounds.

Subsequently, the substrate 100 is subjected to a second baking process. The second baking process may be performed at a temperature in a range of about 90° C. to about 200° C. The exposed region 106*b* of the photoresist layer 106 becomes easily indissoluble regarding a developing solution due to the second baking process.

In FIG. 4, the non-exposed region 106*a* of the photoresist layer is dissolved and removed using the developing solution to form a photoresist pattern 108. In some embodiments, the non-exposed region 106*a* of the photoresist layer is dissolved and removed by using an organic solvent such as, for example, 2-heptanone and/or the like to complete the photoresist pattern 108 corresponding to the negative tone image.

As described above, a developing solution used in a method of forming patterns according to an embodiment may be an organic solvent. The organic solvent used in the method of forming patterns according to an embodiment may be, for example, ketones such as methylethylketone, acetone, cyclohexanone, 2-heptanone, and/or the like, alcohols such as 4-methyl-2-propanol, 1-butanol, isopropanol, 1-propanol, methanol, and/or the like, esters such as propylene glycol monomethyl ether acetate, ethyl acetate, ethyl lactate, n-butyl acetate, butyrolactone, and/or the like, aromatic compounds such as benzene, xylene, toluene, and/or the like, or a combination thereof.

However, the photoresist pattern according to an embodiment is not necessarily limited to the negative tone image but may be formed to have a positive tone image. Herein, a developing agent used for forming the positive tone image may be a quaternary ammonium hydroxide composition such as, for example, tetraethylammonium hydroxide, tetrapropylammonium hydroxide, tetrabutylammonium hydroxide, or a combination thereof.

As described above, exposure to light having a high energy such as, for example, EUV (Extreme Ultraviolet; a wavelength of about 13.5 nm), an E-Beam (an electron beam), and/or the like as well as light having a wavelength such as, for example, i-line (wavelength of about 365 nm), KrF excimer laser (wavelength of about 248 nm), ArF excimer laser (wavelength of about 193 nm), and/or the like may provide a photoresist pattern 108 having a width (or a thickness) in a range of about 5 nm to about 100 nm. For example, the photoresist pattern 108 may have a width (or a thickness) in a range of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm.

In some embodiments, the photoresist pattern 108 may have a pitch such that a half-pitch is less than or equal to about 50 nm, for example less than or equal to about 40 nm, less than or equal to about 30 nm, or less than or equal to about 25 nm and a line width roughness of less than or equal to about 10 nm, or less than or equal to about 5 nm.

Subsequently, the photoresist pattern 108 is used as an etching mask to etch the resist underlayer 104. Through this etching process, an organic layer pattern 112 is formed. The organic layer pattern 112 also may have a width corresponding to that of the photoresist pattern 108.

Referring to FIG. 5, the photoresist pattern 108 is applied as an etching mask to etch the exposed thin layer 102. As a result, the thin layer is formed with a thin layer pattern 114.

The etching of the thin layer 102 may be for example dry etching using an etching gas and the etching gas may be for example CHF$_3$, CF$_4$, Cl$_2$, BCl$_3$, a mixed gas thereof.

In the exposure process, the thin layer pattern 114 formed by using the photoresist pattern 108 formed through the exposure process performed by using an EUV light source may have a width corresponding to that of the photoresist pattern 108. For example, the thin layer pattern 114 may have a width in a range of about 5 nm to about 100 nm which is equal to that of the photoresist pattern 108. For example, the thin layer pattern 114 formed by using the photoresist pattern 108 formed through the exposure process performed by using an EUV light source may have a width in a range of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, about 10 nm to about 20 nm, or for example, less than or equal to about 20 nm, like that of the photoresist pattern 108.

Hereinafter, the present disclosure will be described in more detail with respect to examples of the synthesis of the aforementioned compound and the preparation of the aforementioned semiconductor photoresist composition including the same. However, the present disclosure is technically not restricted by the following Examples.

Preparation of Organometallic Compounds

Synthesis Example 1: Synthesis of Compound Represented by Chemical Formula 4

In a 50 ml 2-neck round-bottomed flask, iPrSnPh$_3$ (3 g, 7.6 mmol) and malonic acid (0.4 g, 3.8 mmol) were dissolved in 20 ml of acetonitrile and then, heated and refluxed for 10 hours. Subsequently, after completely removing the solvent (acetonitrile) through vacuum distillation, propionic acid (2 g, 27 mmol) was added thereto and then, heated and refluxed for 24 hours. The propionic acid was removed through vacuum to obtain a compound represented by Chemical Formula 4 with a yield of 80%.

Chemical Formula 4

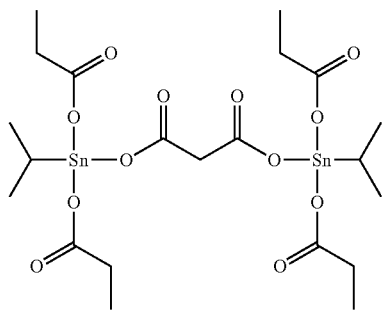

Synthesis Example 2: Synthesis of Compound Represented by Chemical Formula 5

In a 50 ml 2-neck round-bottomed flask, BnSnCl$_3$ (3 g, 9.5 mmol) and Et$_3$N (0.96 g, 9.5 mmol) were dissolved in 20 ml of toluene, and then, malonic acid (0.5 g, 4.8 mmol) dissolved in 10 ml of acetonitrile was slowly added in a dropwise fashion thereto while the 50 ml 2-neck round-bottomed flask was in an ice bath. Subsequently, the mixture was stirred at room temperature for 3 hours, a solid produced therein was removed with a filter, and after completely removing the solvent (toluene and acetonitrile) through vacuum distillation, Et$_3$N (1.92 g, 19 mmol) and 20 ml of toluene were added thereto. Then, propionic acid (1.4 g, 19 mmol) was slowly added thereto in a dropwise fashion while the 50 ml 2-neck round-bottomed flask was in an ice bath and then, stirred at room temperature for 3 hours. Then, a solid produced therein was removed with a filter, and a solvent (toluene) therein was completely removed through vacuum distillation to obtain a compound represented by Chemical Formula 5 with a yield of 60%.

Chemical Formula 5

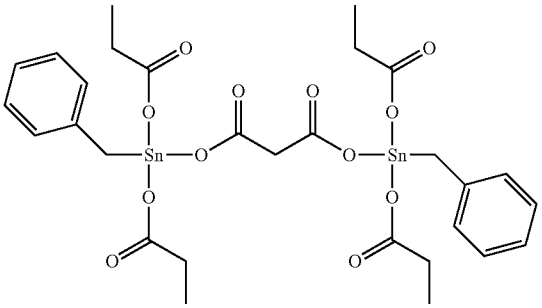

Synthesis Example 3: Synthesis of Compound Represented by Chemical Formula 6

A compound represented by Chemical Formula 6 was obtained with a yield of 82% according to substantially the same method as Synthesis Example 1 except that succinic acid was used instead of the malonic acid.

Chemical Formula 6

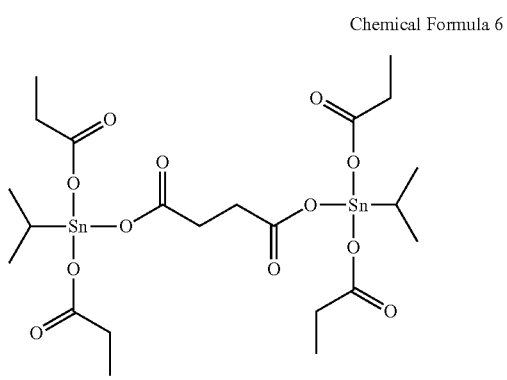 [SMILES: CCC(=O)[O][Sn]([O]C(=O)CC)([O]C(=O)CCC(=O)[O][Sn]([O]C(=O)CC)([O]C(=O)CC)[CH](C)C)[CH](C)C]

Synthesis Example 4: Synthesis of Compound Represented by Chemical Formula 7

In a 50 ml 2-neck round-bottomed flask, iPrSnPh$_3$ (3 g, 7.6 mmol) and malonic acid (0.8 g, 7.6 mmol) were dissolved in 20 ml of acetonitrile and then, heated and refluxed for 10 hours. Subsequently, after completely removing the solvent (acetonitrile) through vacuum distillation, propionic acid (2 g, 27 mmol) was added thereto and then, heated and refluxed for 24 hours to obtain a compound represented by Chemical Formula 7 with a yield of 75%.

Chemical Formula 7

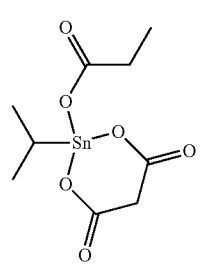

Synthesis Example 5: Synthesis of Compound Represented by Chemical Formula 8

A compound represented by Chemical Formula 8 was obtained with a yield of 79% according to substantially the same method as Synthesis Example 4 except that succinic acid was used instead of the malonic acid.

Chemical Formula 8

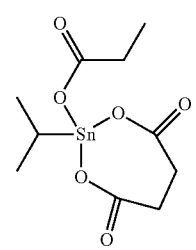

Synthesis Example 6: Synthesis of Compound Represented by Chemical Formula 9

In a 50 ml 2-neck round-bottomed flask, PhSnCl$_3$ (3 g, 9.9 mmol) and Et$_3$N (2 g, 19.8 mmol) were dissolved in 20 ml of toluene, and malonic acid (1 g, 9.9 mmol) dissolved in 10 ml of acetonitrile was slowly added thereto in a dropwise fashion while the 50 ml 2-neck round-bottomed flask was in an ice bath. Subsequently, the resultant mixture was stirred at room temperature for 3 hours, and after removing a solid produced therein with a filter, a solvent (toluene and acetonitrile) therein was completely removed through vacuum distillation, and Et$_3$N (1 g, 9.9 mmol) and 20 ml of toluene were added thereto again. Then, propionic acid (0.73 g, 9.9 mmol) was slowly added thereto in a dropwise fashion while the 50 ml 2-neck round-bottomed flask was in an ice bath and then, then the resultant was stirred for 3 hours at room temperature. After removing the produced solid with a filter, a solvent (toluene) therein was completely removed through vacuum distillation to obtain a compound represented by Chemical Formula 9 with a yield of 65%.

Chemical Formula 9

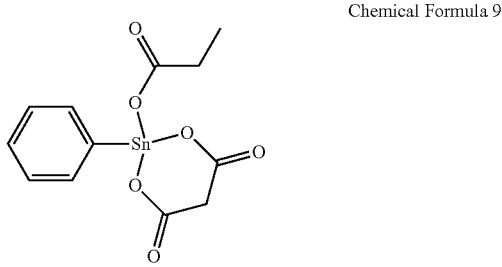 [SMILES: CCC(=O)[O][Sn]1([c]2ccccc2)[O]C(=O)CC(=O)[O]1]

Synthesis Example 7: Synthesis of Compound Represented by Chemical Formula 10

In a 50 ml 2-neck round-bottomed flask, iPrSnPh$_3$ (3 g, 7.6 mmol) and malonic acid (1.2 g, 11.4 mmol) were dissolved in 20 ml of acetonitrile and then, heated and refluxed for 24 hours. Subsequently, the solvent (acetonitrile) was completely removed through vacuum distillation to obtain a compound represented by Chemical Formula 10 with a yield of 83%.

Chemical Formula 10

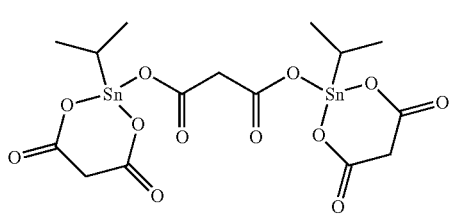

Synthesis Example 8: Synthesis of Compound Represented by Chemical Formula 11

A compound represented by Chemical Formula 11 was obtained with a yield of 82% according to substantially the same method as Synthesis Example 7 except that succinic acid was used instead of the malonic acid.

Chemical Formula 11

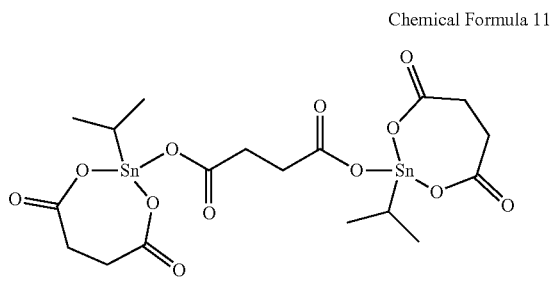 [SMILES: C[CH](C)[Sn]1([O]C(=O)CCC(=O)[O][Sn]2([CH](C)C)[O]C(=O)CCC(=O)[O]2)[O]C(=O)CCC(=O)[O]1]

Comparative Synthesis Example 1: Synthesis of Compound Represented by Chemical Formula 12

Neopentyltin trichloride (10 g, 18.7 mmol) was dissolved in anhydrous pentane and then, cooled down to 0° C. Subsequently, diethylamine (7.4 g, 101.3 mmol) was slowly added thereto in a dropwise fashion, and then, ethanol (6.1 g, 101.3 mmol) was added thereto and then, stirred at room temperature for 1 hour. When a reaction was complete, the solution was filtered, concentrated, and vacuum-dried to obtain a compound represented by Chemical Formula 12 with a yield of 60%.

Chemical Formula 12

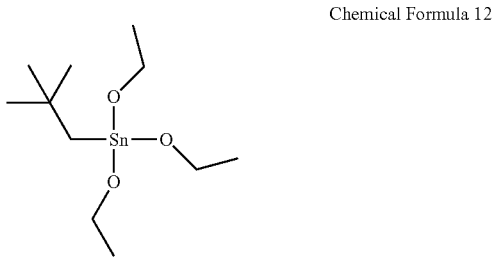

Examples 1 to 8

The compounds represented by Chemical Formulae 4 to 11 synthesized in Synthesis Examples 1 to 8 were respectively dissolved in xylene at a concentration of 2.5 wt % and filtered with a 0.1 μm PTFE syringe filter to prepare semiconductor photoresist compositions according to Examples 1 to 8.

Example 9

The compound represented by Chemical Formula 4 synthesized in Synthesis Example 1 and the compound represented by Chemical Formula 7 synthesized in Synthesis Example 4 were mixed to the same weight (same weight ratio) and then, dissolved in xylene at a concentration of 2.5 wt % and filtered with a 0.1 μm PTFE syringe filter to prepare a semiconductor photoresist composition according to Example 9.

Example 10

The compound represented by Chemical Formula 7 synthesized in Synthesis Example 4 and the compound represented by Chemical Formula 10 synthesized in Synthesis Example 7 were mixed to the same weight (same weight ratio) and then, dissolved in xylene at a concentration of 2.5 wt % and filtered with a 0.1 μm PTFE syringe filter to prepare a semiconductor photoresist composition according to Example 10.

Example 11

The compound represented by Chemical Formula 4 synthesized in Synthesis Example 1, the compound represented by Chemical Formula 7 synthesized in Synthesis Example 4 and the compound represented by Chemical Formula 10 synthesized in Synthesis Example 7 were mixed to the same weight (same weight ratio) and then, dissolved in xylene at a concentration of 2.5 wt % and filtered with a 0.1 μm PTFE syringe filter to prepare a semiconductor photoresist composition according to Example 11.

A circular silicon wafer having a diameter of 4 inches and a native-oxide surface was used as a substrate for depositing a thin film, and the substrate was pretreated under a UV ozone cleaning system for 10 minutes. Subsequently, the photoresist compositions for a semiconductor according to Examples 1 to 11 were respectively spin-coated on the pretreated substrate at 1,500 rpm for 30 seconds, baked (baked after applied, post-apply baked, PAB) on a hot plate at 100° C. for 120 seconds to form thin films.

After the coating and the baking, the thicknesses of the films were measured through Ellipsometry, and were each determined to be about 25 nm.

Comparative Example 1

A compound represented by Chemical Formula 12 synthesized in Comparative Synthesis Example 1 was dissolved in xylene at a concentration of 2 wt % and then, filtered with a 0.1 μm PTFE syringe filter to obtain a compound according to Comparative Example 1.

Subsequently, the semiconductor photoresist composition according to Comparative Example 1 was coated on a substrate through substantially the same process as the examples to form a thin film.

After the coating and the baking, the thicknesses of the film was measured through Ellipsometry, and determined to be about 20 nm.

Evaluation

Evaluation 1: Evaluation of Sensitivity

A linear array of 50 disk pads having a diameter of 500 μm was irradiated into a wafer coated with each of the semiconductor photoresist composition resists according to Example 1 to Example 11 and Comparative Example 1 by using EUV ray (Lawrence Berkeley National Laboratory Micro Exposure Tool, MET). Exposure times of the pads were adjusted to apply an increased EUV dose to each pad.

Subsequently, the resist films on the wafer substrates were exposed on a hotplate at 160° C. for 120 seconds and then, baked (post-exposure bake, PEB). The baked films were respectively dipped in a developing solution (2-heptanone) for 30 seconds and then, additionally cleaned with the same developer for 10 seconds to form negative tone images, remove the coated regions not exposed to EUV light. Finally, the exposed pads were baked on a hot plate at 150° C. for 2 minutes to complete the process.

A residual resist thickness of the exposed pads was measured by using an Ellipsometer. The residual thickness with respect to each exposure dose was measured and graphed as a function of exposure doses, and $D_g$ (does to gel, energy when 95% of an initial thickness remains) depending on types of resists are shown in Table 1.

Evaluation 2: Evaluation of Storage Stability

Additionally, the compounds of Examples 1 to 11 and Comparative Example 1 were evaluated with respect to storage stability according to the following criteria, and the results are shown in Table 1.

Storage Stability

The semiconductor photoresist compositions according to Examples 1 to 11 and Comparative Example 1 were allowed to stand at room temperature (in a range of 0° C. to 30° C.) a time and examined with naked eyes (unassisted eyes) to evaluate a degree of precipitation and then, classified into two groups depending on the following storage standards.

○: can be stored for more than 1 month

X: can be stored for less than 2 weeks

TABLE 1

| | Storage stability | $D_g$ (mJ/cm$^2$) |
|---|---|---|
| Example 1 | ○ | 14.96 |
| Example 2 | ○ | 10.94 |
| Example 3 | ○ | 15.53 |
| Example 4 | ○ | 14.96 |
| Example 5 | ○ | 15.53 |
| Example 6 | ○ | 20.46 |
| Example 7 | ○ | 14.96 |
| Example 8 | ○ | 15.53 |
| Example 9 | ○ | 14.96 |
| Example 10 | ○ | 14.96 |
| Example 11 | ○ | 14.96 |
| Comparative Example 1 | X | 25.21 |

Referring to Table 1, the semiconductor photoresist compositions of Examples 1 to 11 exhibited excellent storage stability compared with that of Comparative Example 1, and in addition, patterns formed of the semiconductor photoresist compositions of Examples 1 to 11 exhibited much more excellent sensitivity compared with that formed of the semiconductor photoresist composition of Comparative Example 1.

Hereinbefore, certain exemplary embodiments of the present disclosure have been described and illustrated, however, it should be apparent to a person with ordinary skill in the art that the present disclosure is not limited to the exemplary embodiment as described, and may be variously modified and transformed without departing from the spirit and scope of the present disclosure. Accordingly, modified or transformed exemplary embodiments are within the scope of the claims of the present disclosure, and equivalents thereof.

| Description of Symbols | |
|---|---|
| 100: substrate | 102: thin layer |
| 104: photoresist underlayer | 106: photoresist layer |
| 106a: non-exposed region | 106b: exposed region |
| 108: photoresist pattern | 112: organic layer pattern |
| 114: thin layer pattern | |

What is claimed is:

1. A semiconductor photoresist composition comprising:

an organometallic compound comprising at least one selected from compounds represented by Chemical Formulae 1 to 3, and a solvent:

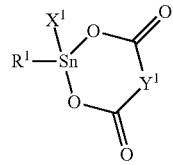

Chemical Formula 1

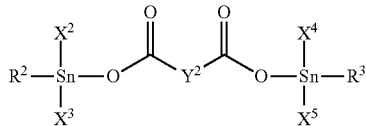

Chemical Formula 2

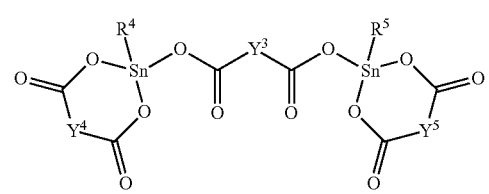

Chemical Formula 3 wherein in Chemical Formulae 1 to 3, $R^1$ to $R^5$ are each independently a substituted or unsubstituted C1 to C20 alkyl group, a substituted or unsubstituted C3 to C20 cycloalkyl group, a substituted or unsubstituted C6 to C20 aryl group, or a combination thereof, $X^1$ to $X^5$ are each independently —$OR^a$ or —$OC(=O)R^b$, $R^a$ and $R^b$ are each independently hydrogen, a substituted or unsubstituted monovalent C1 to C20 saturated aliphatic hydrocarbon group, a substituted or unsubstituted monovalent C3 to C20 saturated alicyclic hydrocarbon group, a substituted or unsubstituted monovalent C2 to C20 unsaturated aliphatic hydrocarbon group including at least one double bond and/or triple bond, a substituted or unsubstituted monovalent C6 to C30 aromatic hydrocarbon group, or a combination thereof, and $Y^1$ to $Y^5$ are each independently a single bond, a substituted or unsubstituted divalent C1 to C20 saturated aliphatic hydrocarbon group, a substituted or unsubstituted divalent C3 to C20 saturated alicyclic hydrocarbon group, a substituted or unsubstituted divalent C2 to C20 unsaturated aliphatic hydrocarbon group including at least one double bond and/or triple bond, a substituted or unsubstituted divalent C6 to C20 aromatic hydrocarbon group, or a combination thereof.

2. The semiconductor photoresist composition of claim 1, wherein:

$R^1$ to $R^5$ are each independently a substituted or unsubstituted C1 to C10 alkyl group, a substituted or unsubstituted C3 to C10 cycloalkyl group, a substituted or unsubstituted C6 to C10 aryl group, or a combination thereof, $R^a$ and $R^b$ are each independently hydrogen, a substituted or unsubstituted monovalent C1 to C10 saturated aliphatic hydrocarbon group, a substituted or unsubstituted monovalent C3 to C10 saturated alicyclic hydrocarbon group, a substituted or unsubstituted monovalent C2 to C10 unsaturated aliphatic hydrocarbon group including 1 or 2 double bonds and/or triple bonds, a substituted or unsubstituted monovalent C6 to C10 aromatic hydrocarbon group, or a combination thereof, and $Y^1$ to $Y^5$ are each independently a single bond, a substituted or unsubstituted divalent C1 to C8 saturated aliphatic hydrocarbon group, a substituted or unsubstituted divalent C3 to C6 saturated alicyclic hydrocarbon group, a substituted or unsubstituted divalent C2 to C8 unsaturated aliphatic hydrocarbon group including 1 or 2 double bonds and/or triple bonds, a substituted or unsubstituted divalent C6 to C10 arylene group, or a combination thereof.

3. The semiconductor photoresist composition of claim 1, wherein:
$R^1$ to $R^5$ are each independently a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, a phenyl group, a tolyl group, a xylene group, a benzyl group, or a combination thereof,
$R^a$ and $R^b$ are each independently hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and
$Y^1$ to $Y^5$ are each independently a single bond, a methylene group, an ethylene group, a propylene group, a butylene group, a cyclobutylene group, a cyclopentylene group, a cyclohexylene group, an ethenylene group, a propenylene group, a phenylene group, or a combination thereof.

4. The semiconductor photoresist composition of claim 1, wherein:
$R^1$ to $R^5$ are each independently one of a methyl group, an ethyl group, an isopropyl group, a tert-butyl group, a phenyl group, and a benzyl group,
$R^a$ and $R^b$ are each independently a methyl group or an ethyl group, and
$Y^1$ to $Y^5$ are each independently one of a single bond, a methylene group, and an ethylene group.

5. The semiconductor photoresist composition of claim 1, wherein in Chemical Formula 2, $R^2$ and $R^3$ are the same, and $X^2$ to $X^5$ are all the same.

6. The semiconductor photoresist composition of claim 1, wherein, in Chemical Formula 3, $R^4$ and $R^5$ are the same, and $Y^4$ and $Y^5$ are the same.

7. The semiconductor photoresist composition of claim 1, wherein the semiconductor photoresist composition comprises an organometallic compound comprising compounds that are respectively represented by each of Chemical Formulae 1 to 3.

8. The semiconductor photoresist composition of claim 1, wherein the semiconductor photoresist composition comprises about 1 wt % to about 20 wt % of the at least one selected from the compounds represented by Chemical Formulae 1 to 3, based on 100 wt % of the semiconductor photoresist composition.

9. The semiconductor photoresist composition of claim 8, wherein the semiconductor photoresist composition comprises about 1 wt % to about 20 wt % of the compound represented by Chemical Formula 1, based on 100 wt % of the semiconductor photoresist composition.

10. The semiconductor photoresist composition of claim 8, wherein the semiconductor photoresist composition comprises about 1 wt % to about 20 wt % of the compound represented by Chemical Formula 2, based on 100 wt % of the semiconductor photoresist composition.

11. The semiconductor photoresist composition of claim 8, wherein the semiconductor photoresist composition comprises about 1 wt % to about 20 wt % of the compound represented by Chemical Formula 3, based on 100 wt % of the semiconductor photoresist composition.

12. The semiconductor photoresist composition of claim 1, wherein the semiconductor photoresist composition further comprises an additive comprising a surfactant, a cross-linking agent, a leveling agent, or a combination thereof.

13. A method of forming patterns, comprising:
forming an etching-objective layer on a substrate;
coating the semiconductor photoresist composition of claim 1 on the etching-objective layer to form a photoresist layer;
patterning the photoresist layer to form a photoresist pattern; and
etching the etching-objective layer using the photoresist pattern as an etching mask.

14. The method of claim 13, wherein the photoresist pattern is formed using light having a wavelength in a range of about 5 nm to about 150 nm.

* * * * *